United States Patent
Kan et al.

(10) Patent No.: US 10,381,060 B2
(45) Date of Patent: Aug. 13, 2019

(54) HIGH-SPEED, LOW POWER SPIN-ORBIT TORQUE (SOT) ASSISTED SPIN-TRANSFER TORQUE MAGNETIC RANDOM ACCESS MEMORY (STT-MRAM) BIT CELL ARRAY

(71) Applicant: QUALCOMM Incorporated, San Diego, CA (US)

(72) Inventors: Jimmy Jianan Kan, San Diego, CA (US); Chando Park, Irvine, CA (US); Peiyuan Wang, San Diego, CA (US); Sungryul Kim, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 23 days.

(21) Appl. No.: 15/247,791

(22) Filed: Aug. 25, 2016

(65) Prior Publication Data
US 2018/0061467 A1 Mar. 1, 2018

(51) Int. Cl.
*G11C 11/16* (2006.01)
*H01L 27/22* (2006.01)

(52) U.S. Cl.
CPC ........ *G11C 11/1675* (2013.01); *G11C 11/161* (2013.01); *G11C 11/1659* (2013.01); *H01L 27/222* (2013.01)

(58) Field of Classification Search
CPC .. G11C 11/1675; G11C 11/161; H01L 27/222
See application file for complete search history.

(56) References Cited

U.S. PATENT DOCUMENTS

| | | | |
|---|---|---|---|
| 8,963,222 B2 | 2/2015 | Guo | |
| 9,218,864 B1 | 12/2015 | Yi et al. | |
| 9,343,658 B2 | 5/2016 | Wang et al. | |
| 9,614,002 B1 | 4/2017 | Hatcher et al. | |
| 9,858,975 B1* | 1/2018 | Hatcher | G11C 11/1655 |

(Continued)

FOREIGN PATENT DOCUMENTS

WO 2016011435 A1 1/2016

OTHER PUBLICATIONS

Eken E., et al., "Spin-Hall Assisted STT-RAM Design and Discussion", Jun. 4, 2016, pp. 1-4, XP058261871, DOI: 10.1145/2947357.2947360, ISBN: 978-1-4503-4430-2.

(Continued)

*Primary Examiner* — Tri M Hoang
(74) *Attorney, Agent, or Firm* — Qualcomm Incorporated/Seyfarth Shaw LLP

(57) ABSTRACT

A magnetic random access memory (MRAM) array including several bit cells is described. Each of the bit cells may include a perpendicular magnetic tunnel junction (pMTJ) including a reference layer, a barrier layer supporting the reference layer, and a free layer supporting the barrier layer. A spin-hall conductive material layer may support the free layer. A driver may be operable to set a state of at least one of the bit cells using an increased spin-transfer torque (STT) current and a spin-hall effect from the spin-hall conductive material layer. The increased STT current may be driven through the spin-hall conductive material layer and the pMTJ so that a spin current is generated from the reference layer and the spin-hall conductive material layer.

18 Claims, 11 Drawing Sheets

(56) References Cited

U.S. PATENT DOCUMENTS

| | | | |
|---|---|---|---|
| 2009/0185410 A1* | 7/2009 | Huai | G11C 11/16 365/158 |
| 2010/0097852 A1 | 4/2010 | Chen et al. | |
| 2014/0252439 A1* | 9/2014 | Guo | G11C 11/18 257/295 |
| 2015/0213865 A1 | 7/2015 | Wu et al. | |
| 2016/0042778 A1* | 2/2016 | Manipatruni | G11C 11/18 365/66 |
| 2016/0043301 A1 | 2/2016 | Butler et al. | |
| 2016/0276006 A1* | 9/2016 | Ralph | G11C 11/18 |

OTHER PUBLICATIONS

International Search Report and Written Opinion—PCT/US2017/043691—ISA/EPO—dated Oct. 30, 2017.
Wang Z., et al.,"Perpendicular-Anisotropy Magnetic Tunnel Junction Switched by Spin-Hall-assisted Spin-Transfer Torque", Journal of Physics D: Applied Physics, Institute of Physics Publishing Ltd, GB, vol. 48, No. 6, Jan. 22, 2015, XP020278911, ISSN: 0022-3727, DOI: 10.1088/0022-3727/48/6/065001 [retrieved on Jan. 22, 2015], 8 pages.

* cited by examiner

HIGH-SPEED, LOW POWER SPIN-ORBIT TORQUE (SOT) ASSISTED SPIN-TRANSFER TORQUE MAGNETIC RANDOM ACCESS MEMORY (STT-MRAM) BIT CELL ARRAY

BACKGROUND

Field

Certain aspects of the present disclosure generally relate to magnetic tunneling junction (MTJ) devices, and more particularly to a process friendly high speed, low power spin-orbit torque (SOT) assisted spin-transfer torque magnetic random access memory (STT-MRAM) bit cell array.

Background

Unlike conventional random access memory (RAM) chip technologies, in magnetic RAM (MRAM), data is stored by magnetization of storage elements. The basic structure of the storage elements consists of metallic ferromagnetic layers separated by a thin tunneling barrier. One of the ferromagnetic layers (e.g., the ferromagnetic layer underneath the barrier) has a magnetization that is fixed in a particular direction, and is commonly referred to as the pinned layer. The other ferromagnetic layers (e.g., the ferromagnetic layer above the tunneling barrier) have a magnetization direction that may be altered to represent either a "1" or a "0," and are commonly referred to as the free layers.

For example, a "1" may be represented when the free layer magnetization is anti-parallel to the fixed layer magnetization. In addition, a "0" may be represented when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel to each other. A memory device such as MRAM is built from an array of individually addressable MTJs.

To write data in a conventional MRAM, a write current, which exceeds a critical switching current, is applied through an MTJ. Application of a write current that exceeds the critical switching current changes the magnetization direction of the free layer. When the write current flows in a first direction, the MTJ may be placed into or remain in a first state in which its free layer magnetization direction and fixed layer magnetization direction are aligned in a parallel orientation. When the write current flows in a second direction, opposite to the first direction, the MTJ may be placed into or remain in a second state in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a parallel resistance. The parallel resistance is different than a resistance (anti-parallel) the MTJ would present if the magnetizations of the free layer and the fixed layer were in an anti-parallel orientation. In a conventional MRAM, two distinct states are defined by these two different resistances of an MTJ in a bitcell of the MRAM. The two different resistances indicate whether a logic "0" or a logic "1" value is stored by the MTJ.

Spin-transfer torque magnetic random access memory (STT-MRAM) is an emerging nonvolatile memory that has advantages of non-volatility. In particular, STT-MRAM embedded with logic circuits may operate at a comparable or higher speed than off chip dynamic random access memory (DRAM). In addition, STT-MRAM has a smaller chip size than embedded static random access memory (eSRAM), virtually unlimited read/write endurance as compared with FLASH, and a low array leakage current.

In particular, spin-transfer torque (STT) efficiency and retention are specified parameters in the design of the MTJ for an embedded STT-MRAM. As a result, perpendicular STT-MRAM has become a leading candidate for providing next-generation embedded non-volatile memory. While STT-MRAM is a promising candidate for use as a unified memory for low power MCU (memory control unit) or IoT (Internet of things) applications, STT-MRAM is still not fast/low-power enough to serve as cache replacement memory (e.g., last-level cache (LLC) or otherwise). In particular, a write speed and power of STT-MRAM is insufficient to replace conventional static RAM (SRAM), which exhibits a write time in the sub-nanosecond range.

SUMMARY

A magnetic random access memory (MRAM) array that may include several bit cells is described. Each of the bit cells may include a perpendicular magnetic tunnel junction (pMTJ) including a reference layer, a barrier layer supporting the reference layer, and a free layer supporting the barrier layer. A spin-hall conductive material layer may support the free layer. A driver may be operable to set a state of at least one of the bit cells using an increased spin-transfer torque (STT) current and a spin-hall effect from the spin-hall conductive material layer. The increased STT current may be driven through the spin-hall conductive material layer and the pMTJ so that a spin current is generated from the reference layer and the spin-hall conductive material layer.

A method of storing memory in a magnetic random access memory (MRAM) array may include driving an increased spin-transfer torque (STT) current through a spin-hall conductive material and a perpendicular magnetic tunnel junction (pMTJ). This may generate a spin current from a reference layer of the pMTJ and the spin-hall conductive material. The method may further include setting a state of a bit cell using the increased STT current and a spin-hall effect from the spin-hall conductive material.

A magnetic random access memory (MRAM) array may include several bit cells. Each of the bit cells may include a perpendicular magnetic tunnel junction (pMTJ) including a reference layer, a barrier layer supporting the reference layer, and a free layer supporting the barrier layer. A spin-hall conductive material layer may support the free layer. The MRAM array may also include a means for setting a state of at least one of the bit cells using an increased spin-transfer torque (STT) current and a spin-hall effect from the spin-hall conductive material layer. The increased STT current may be driven through the spin-hall conductive material layer and the pMTJ so that a spin current may be generated from the reference layer and the spin-hall conductive material layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
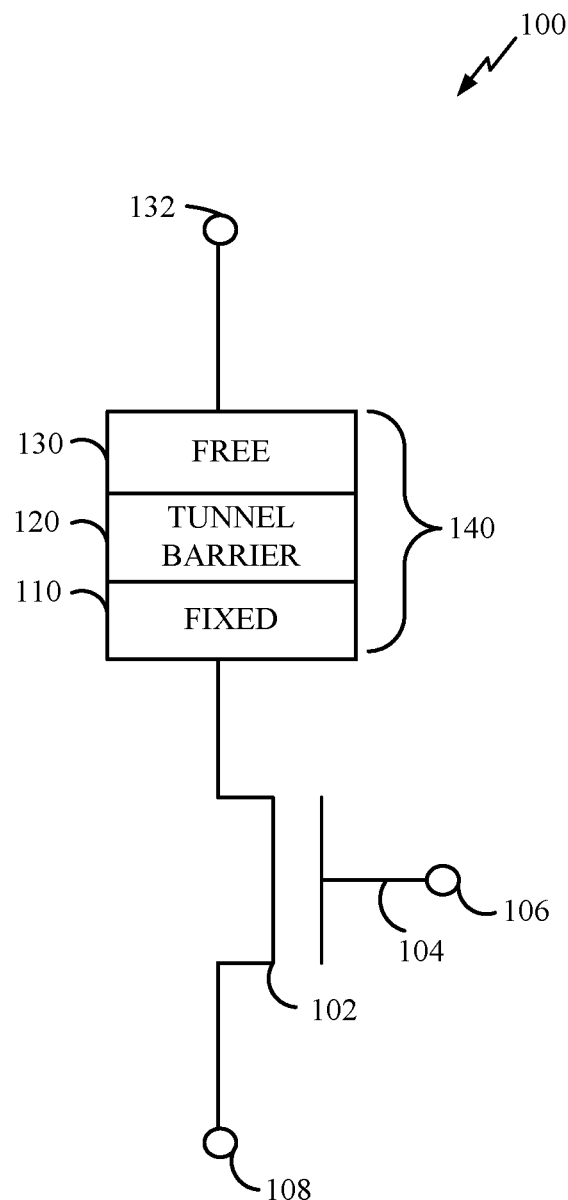
FIG. 1 is a diagram of a magnetic tunnel junction (MTJ) device connected to an access transistor.

The detailed description set forth below, in connection with the appended drawings, is intended as a description of various configurations and is not intended to represent the only configurations in which the described concepts may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR," and the use of the term "or" is intended to represent an "exclusive OR."

Spin-transfer torque magnetic random access memory (STT-MRAM) is an emerging nonvolatile memory that has advantages of non-volatility. In particular, STT-MRAM embedded with logic circuits may operate at a comparable or higher speed than off chip dynamic random access memory (DRAM). In addition, STT-MRAM has a smaller chip size than embedded static random access memory (eSRAM), virtually unlimited read/write endurance as compared with FLASH, and a low array leakage current. In particular, STT-MRAM is fast, and non-volatile, relative to other non-volatile memory options, such as resistive RAM (RRAM), ferroelectric RAM (FRAM), eFlash, and the like.

Spin-transfer torque (STT) efficiency and retention are design parameters for an embedded STT-MRAM that are improved when a perpendicular MTJ (pMTJ) is used as a memory cell. As a result, perpendicular STT-MRAM has become a leading candidate for providing next-generation embedded non-volatile memory. While perpendicular STT-MRAM is a promising candidate for use as a unified memory for low power MCU (memory control unit) or IoT (Internet of things) applications, perpendicular STT-MRAM is still not fast/low-power enough to serve as cache replacement memory (e.g., low level cache (LLC) or otherwise). In particular, a write speed of perpendicular STT-MRAM is still insufficient to replace conventional static RAM (SRAM), which exhibits a write time in the sub-nanosecond range. Accordingly, there is a need for improvement of the switching/writing of pMTJs, without degrading other properties such as read performance, endurance, or retention.

Various aspects of the disclosure provide techniques for spin-orbit torque (SOT) assisted perpendicular STT-MRAM. The process flow for accessing an MTJ may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to the substrate of a wafer that is not diced. Similarly, the terms wafer and die may be used interchangeably unless such interchanging would tax credulity.

As described, the back-end-of-line interconnect layers may refer to the conductive interconnect layers (e.g., metal one (M1), metal two (M2), metal three (M3), etc.) for electrically coupling to front-end-of-line active devices of an integrated circuit. The back-end-of-line interconnect layers may electrically couple to middle-of-line interconnect layers for, for example, connecting M1 to an oxide diffusion (OD) layer of an integrated circuit. A back-end-of-line first via (V2) may connect M2 to M3 or others of the back-end-of-line interconnect layers. The front-end-of-line processes may include the set of process steps that form the active devices, such as transistors, capacitors, diodes. The front-end-of-line processes include ion implantation, anneals, oxidation, CVD (chemical vapor deposition) or ALD (atomic layer deposition), etching, CMP (chemical mechanical polishing), epitaxy.

The middle-of-line processes may include the set of process steps that enable connection of the transistors to the back-end-of-line interconnects (e.g., M1 . . . M8). These steps include silicidation and contact formation as well as stress introduction. The back-end-of-line processes may include the set of process steps that form the interconnect that ties the independent transistors and form circuits. Currently, copper and aluminum are used to form the interconnects, but with further development of the technology, other conductive material may be used.

Aspects of the present disclosure are directed to improving the switching/writing of MTJs without degrading other properties such as read performance, endurance, or retention. One aspect of the present disclosure is directed to spin-orbit torque (SOT) assisted MRAM switching for increasing switch speed and endurance, while reducing switching energy. In this aspect of the present disclosure, a spin-transfer torque (STT) current ($I_{STT}$) is relied on to select the state of the SOT assisted MRAM.

A bit cell array may include bit cells, with each bit cell including a magnetic tunnel junction (MTJ). The MTJ may include a reference layer, a barrier layer supporting the reference layer, and a free layer supporting the barrier layer. In addition, the memory cell may include a spin-hall conductive material layer supporting the free layer of the MTJ. The MRAM array may also include a driver operable to set a state of at least one of the bit cells using a spin-transfer torque (STT) current ($I_{STT}$). In aspects of the present disclosure, an MTJ resistance ($R_{MTJ}$) and a spin-hall effect resistance ($R_{SHE}$) are tuned to direct the STT current ($I_{STT}$) through the MTJ to set a write value. This may be performed by tuning the MTJ resistance (e.g., using a resistance array product (RA) or size) according to the STT current $I_{STT}$.

FIG. 1 illustrates a memory cell 100 of a memory device including a magnetic tunnel junction (MTJ) 140 coupled to an access transistor 102. The memory device may be a magnetic random access memory (MRAM) device that is built from an array of individually addressable MTJs. An MTJ stack may include a free layer, a fixed layer and a tunnel barrier layer there between as well as one or more ferromagnetic (or anti-ferromagnetic) layers. Representatively, a free layer 130 of the MTJ 140 is coupled to a bit line 132. The access transistor 102 is coupled between a fixed layer 110 of the MTJ 140 and a fixed potential node 108. A tunnel barrier layer 120 is coupled between the fixed layer 110 and the free layer 130. The access transistor 102 includes a gate 104 coupled to a word line 106.

Synthetic anti-ferromagnetic materials may form the fixed layer 110 and the free layer 130. For example, the fixed layer 110 may include multiple material layers including a cobalt-iron-boron (CoFeB) layer, a ruthenium (Ru) layer and a cobalt-iron (CoFe) layer. In addition, the free layer 130 may also include multiple material layers including a cobalt-iron-boron (CoFeB) layer, a ruthenium (Ru) layer and a cobalt-iron (CoFe) layer. Further, the tunnel barrier layer 120 may be magnesium oxide (MgO).

Figure 2:
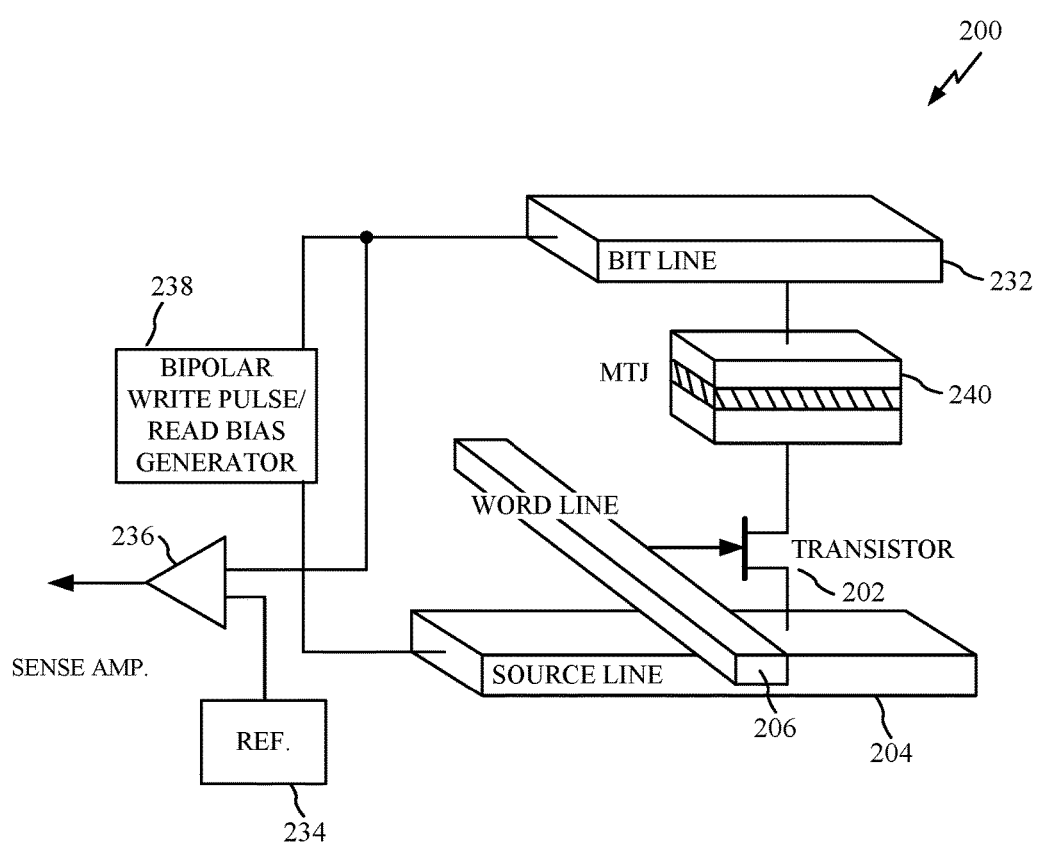
FIG. 2 is a conceptual diagram of a conventional magnetic random access memory (MRAM) cell including an MTJ.

FIG. 2 illustrates a conventional STT-MRAM bit cell 200. The STT-MRAM bit cell 200 includes a magnetic tunnel junction (MTJ) storage element 240, a transistor 202, a bit line 232 and a word line 206. The MTJ storage element 240 is formed, for example, from at least two anti-ferromagnetic layers (a pinned layer and a free layer), each of which can hold a magnetic field or polarization, separated by a thin non-magnetic insulating layer (tunneling barrier). Electrons from the two ferromagnetic layers can penetrate through the tunneling barrier due to a tunneling effect under a bias voltage applied to the ferromagnetic layers. The magnetic polarization of the free layer can be reversed so that the polarity of the pinned layer and the free layer are either substantially aligned or opposite. The resistance of the electrical path through the MTJ varies depending on the alignment of the polarizations of the pinned and free layers. This variance in resistance may program and read the bit cell 200. The STT-MRAM bit cell 200 and peripheral circuits also include a source line 204, a sense amplifier 236, read/write circuitry 238 and a bit line reference 234

Magnetic Random Access Memory

Materials that form a magnetic tunnel junction (MTJ) of an MRAM generally exhibit high tunneling magneto resistance (TMR), high perpendicular magnetic anisotropy (PMA) and good data retention. MTJ structures may be made in a perpendicular orientation, referred to as perpendicular magnetic tunnel junction (pMTJ) devices. A stack of materials (e.g., cobalt-iron-boron (CoFeB) materials) with a dielectric barrier layer (e.g., magnesium oxide (MgO)) may be employed in a pMTJ structure. A pMTJ structure including a stack of materials (e.g., CoFeB/MgO/CoFeB) has been considered for MRAM structures.

Figure 3:
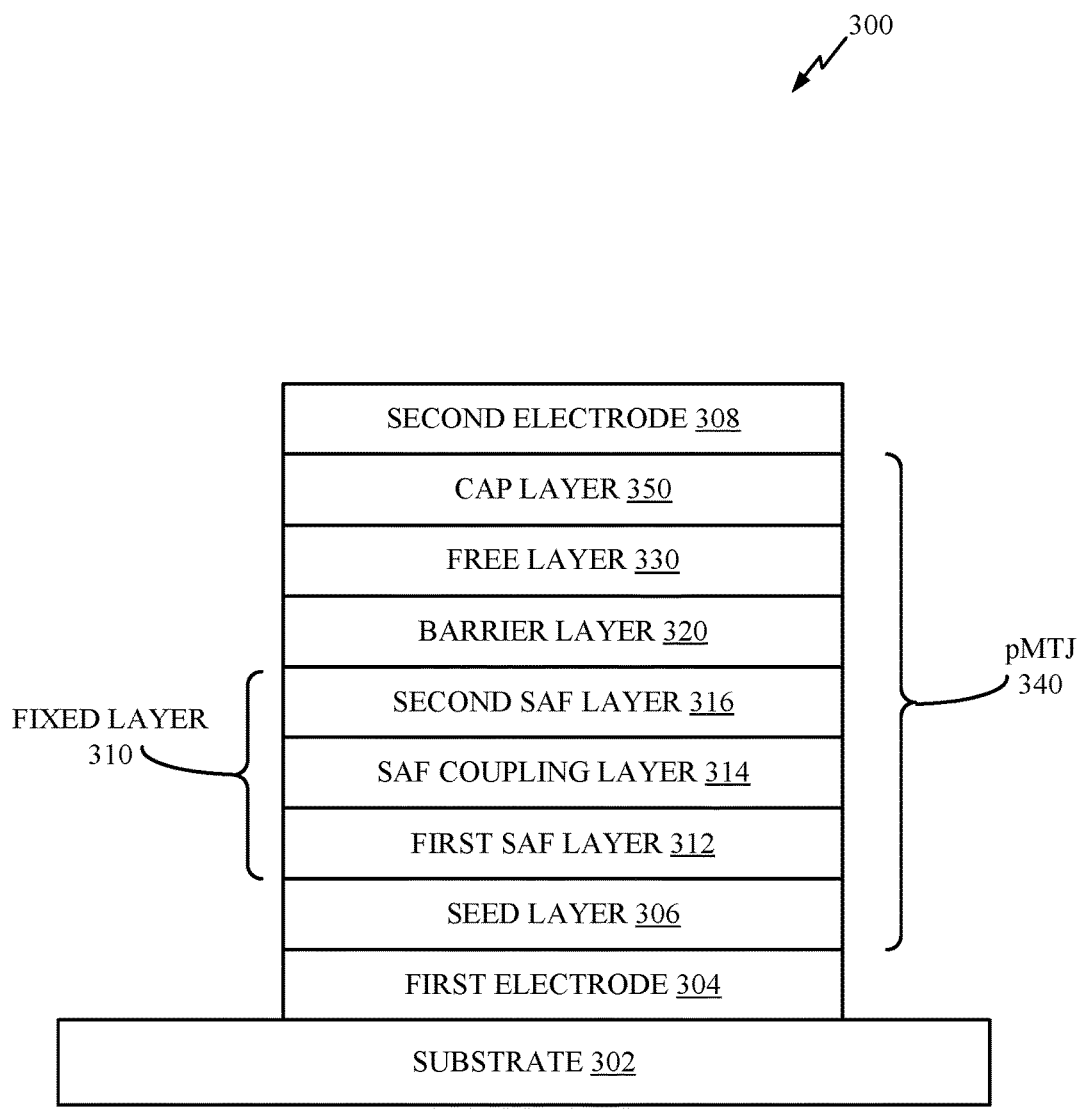
FIG. 3 is a cross-sectional diagram illustrating a conventional perpendicular magnetic tunnel junction (pMTJ) stack structure.

FIG. 3 illustrates a cross-sectional view of a conventional perpendicular magnetic tunnel junction (pMTJ) structure. Representatively, an MTJ structure 300, which is shown as a pMTJ structure 340 in FIG. 3, is formed on a substrate 302. The MTJ structure 300 may be formed on a semiconductor substrate, such as a silicon substrate, or any other alternative suitable substrate material. The MTJ structure 300 may include a first electrode 304, a seed layer 306, and a fixed layer 310. The fixed layer 310 includes a first synthetic antiferromagnetic (SAF) layer 312, a SAF coupling layer 314, and a second SAF layer 316. The MTJ structure 300 also includes a barrier layer 320, a free layer 330, a cap layer 350 (also known as a capping layer), and a second electrode 308. The MTJ structure 300 may be a part of various types of devices, such as a semiconductor memory device (e.g., MRAM).

In this configuration, the first electrode 304 and the second electrode 308 include conductive materials (e.g., tantalum (Ta)). In other configurations, the first electrode 304 and/or second electrode 308 may include other appropriate materials, including but not limited to platinum (Pt), copper (Cu), gold (Au), aluminum (Al), or other like conductive materials. The first electrode 304 and the second electrode 308 may employ different materials within the MTJ structure 300.

A seed layer 306 is formed on the first electrode 304. The seed layer 306 may provide a mechanical and crystalline substrate for the first SAF layer 312. The seed layer 306 may be a compound material, including but not limited to, nickel chromium (NiCr), nickel iron (NiFe), NiFeCr, or other suitable materials for the seed layer 306. When the seed layer 306 is grown or otherwise coupled to the first electrode 304, a smooth and dense crystalline structure results in the seed layer 306. In this configuration, the seed layer 306 promotes growth of subsequently formed layers in the MTJ structure 300 according to a specific crystalline orientation. The crystalline structure of the seed layer 306 may be selected to be any crystal orientation within the Miller index notation system, but is often chosen to be in the (111) crystal orientation.

A first SAF layer 312 is formed on the seed layer 306. The first SAF layer 312 includes a multilayer stack of materials formed on the seed layer 306, which may be referred to herein as a first anti-parallel pinned layer (AP1). The multilayer stack of materials in the first SAF layer 312 may be an anti-ferromagnetic material or a combination of materials to create an anti-ferromagnetic moment in the first SAF layer 312. The multilayer stack of materials forming the first SAF layer 312 include, but are not limited to, cobalt (Co), cobalt in combination with other materials such as nickel (Ni), platinum (Pt), or palladium (Pd), or other like ferromagnetic materials.

An SAF coupling layer 314 is formed on the first SAF layer 312, and promotes magnetic coupling between the first SAF layer 312 and a second SAF layer 316. The second SAF layer 316 has a magnetic orientation anti-parallel with the first SAF layer 312. The SAF coupling layer 314 includes material that aides in this coupling including, but not limited to, ruthenium (Ru), tantalum (Ta), gadolinium (Gd), platinum (Pt), hafnium (Hf), osmium (Os), rhodium (Rh), niobium (Nb), terbium (Tb), or other like materials. The SAF coupling layer 314 may also include materials to provide mechanical and/or crystalline structural support for the first SAF layer 312 and the second SAF layer 316.

The second SAF layer 316 is formed on the SAF coupling layer 314. The second SAF layer 316 may have similar materials as the first SAF layer 312, but may include other materials. The combination of the first SAF layer 312, the SAF coupling layer 313, and the second SAF layer 316 forms the fixed layer 310 including the SAF reference layers, which is often referred to as a "pinned layer" in the MTJ structure 300. The fixed layer 310 fixes, or pins, the magnetization direction of the SAF reference layers (e.g., 312, 314, 316) through anti-ferromagnetic coupling. As described herein, the second SAF layer 316 may be referred to as a second anti-parallel pinned layer (AP2). In this arrangement, the first SAF layer 312 may be referred to as a first anti-parallel pinned layer (AP1) that is separated from the second anti-parallel pinned layer (AP2) by the SAF coupling layer 314 to form the fixed layer 310. The fixed layer 310 may include a cobalt-iron-boron (CoFeB) film. The fixed layer 310 may also include other ferromagnetic material layers or multilayers, such as CoFeTa, NiFe, Co, CoFe, CoPt, CoPd, FePt, or any alloy of Ni, Co and Fe.

A TMR enhancement layer of the fixed layer 310 abutting the barrier layer 320 may be formed of a material, such as CoFeB, that provides a crystalline orientation for the barrier layer 320. As with the seed layer 306, the material in the fixed layer 310 provides a template for subsequent layers to be grown in a specific crystalline orientation. This orientation may be in any direction within the Miller index system, but is often in the (100) (or (001)) crystal orientation.

The barrier layer 320 (also referred to as a tunnel barrier layer) is formed on the fixed layer 310. The barrier layer 320 provides a tunnel barrier for electrons travelling between the fixed layer 310 and the free layer 330. The barrier layer 320, which may include magnesium oxide (MgO), is formed on the fixed layer 310 and may have a crystalline structure. The crystalline structure of the barrier layer 320 may be in the (100) direction. The barrier layer 320 may include other elements or other materials, such as aluminum oxide (AlO), aluminum nitride (AlN), aluminum oxynitride (AlON), or other non-magnetic or dielectric material. The thickness of the barrier layer 320 is selected so that electrons can tunnel from the fixed layer 310 through the barrier layer 320 to the free layer 330 when a biasing voltage is applied to the MTJ structure 300.

The free layer 330, which may be cobalt-iron-boron (CoFeB), is formed on the barrier layer 320. The free layer 330, when initially deposited on the barrier layer 320, is an amorphous structure. That is, the free layer 330 does not have a crystalline structure when initially deposited on the barrier layer 320. The free layer 330 is also an anti-ferromagnetic layer or multilayer material, which may include similar anti-ferromagnetic materials as the fixed layer 310 or may include different materials.

In this configuration, the free layer 330 includes an anti-ferromagnetic material that is not fixed or pinned in a specific magnetic orientation. The magnetization orientation of the free layer 330 is able to rotate to be in a parallel or an anti-parallel direction to the pinned magnetization of the fixed layer 310. A tunneling current flows perpendicularly through the barrier layer 320 depending upon the relative magnetization directions of the fixed layer 310 and the free layer 330.

A cap layer 350 is formed on the free layer 330. The cap layer 350 may be a dielectric layer, or other insulating layer. The cap layer 350 helps reduce the switching current density that switches the MTJ structure 300 from one orientation (e.g., parallel) to the other (e.g., anti-parallel) and improves perpendicular magnetic anisotropy. The cap layer 350, which may also be referred to as a capping layer, may be an oxide, such as, for example, amorphous aluminum oxide (AlOx) or amorphous hafnium oxide (HfOx). The cap layer 350 may also be other materials, such as magnesium oxide (MgO) or other dielectric materials without departing from the scope of the present disclosure.

The second electrode 308 is formed on the cap layer 350. In one configuration, the second electrode 308 includes tantalum. Alternatively, the second electrode 308 includes any other suitable conductive material for electrical connection of the MTJ structure 300 to other devices or portions of a circuit. Formation of the second electrode 308 on the cap layer 350 completes the MTJ structure 300.

Aspects of the present disclosure are directed to improve the switching/writing of MTJs without degrading other properties such as read performance, endurance, or retention. One aspect of the present disclosure is directed to spin-orbit torque (SOT) assisted MRAM switching for increasing switch speed and endurance, while reducing switching energy. In this aspect of the present disclosure, a spin-transfer torque (STT) current (e.g., $I_{STT}$) is relied on to select the state of the SOT assisted MRAM. Additionally, a top pinned MTJ is used instead of the bottom pinned MTJ that was described above in FIG. 3. In a top pinned MTJ, the free layer is on the bottom instead of on the top, which can be achieved by inverting the MTJ stack of FIG. 3.

Spin-hall effect (SHE) is a spintronic analogue to the conventional hall effect. For example, spin-orbit torque (SOT) due to the spin-hall effect may originate from the coupling of charge and spin currents due to spin-orbit interactions. Due to the spin-hall effect, charge current flowing through a spin-hall metal (SHM) results in spin accumulation (e.g., spatial separation) at interfaces due to spin-orbit interaction. This phenomenon is due to an electron scattering mechanism, in which the electrons are separated according to their spin sign.

Spin-orbit torque may provide an efficient means for generating a spin polarized current that may be used as a spin torque for switching a state of an in-plane MTJ. In-plane MTJs, however, exhibit substantially worse retention, temperature corner performance, and scalability than perpendicular MTJs (pMTJs). Unfortunately, spin-orbit torque cannot reliably switch a state (e.g., parallel/anti-parallel) for a pMTJ. That is, reversal of the state of a pMTJ is non-deterministic when performed using spin-orbit torque because the parallel/anti-parallel state of the pMTJ is not deterministically affected by the in-plane spin-orbit torque.

According to aspects of the present disclosure, a spin-orbit torque assisted STT-MRAM design takes advantage of a fast reversal speed of spin-orbit torque, while relying on perpendicular STT to select the state (e.g., parallel/anti-parallel). This design includes a pMTJ (e.g., a top pinned pMTJ) for superior retention and resilience to an external field. In addition, this technique involves a lower voltage across a barrier layer (e.g., magnesium oxide (MgO)) for improved endurance (e.g., 5-10× reduction in $V_{barrier}$). In addition, this technique improves a read speed by allowing a large bias read (e.g., $V_{read}$ can be larger than $V_{write}$).

Figure 4:
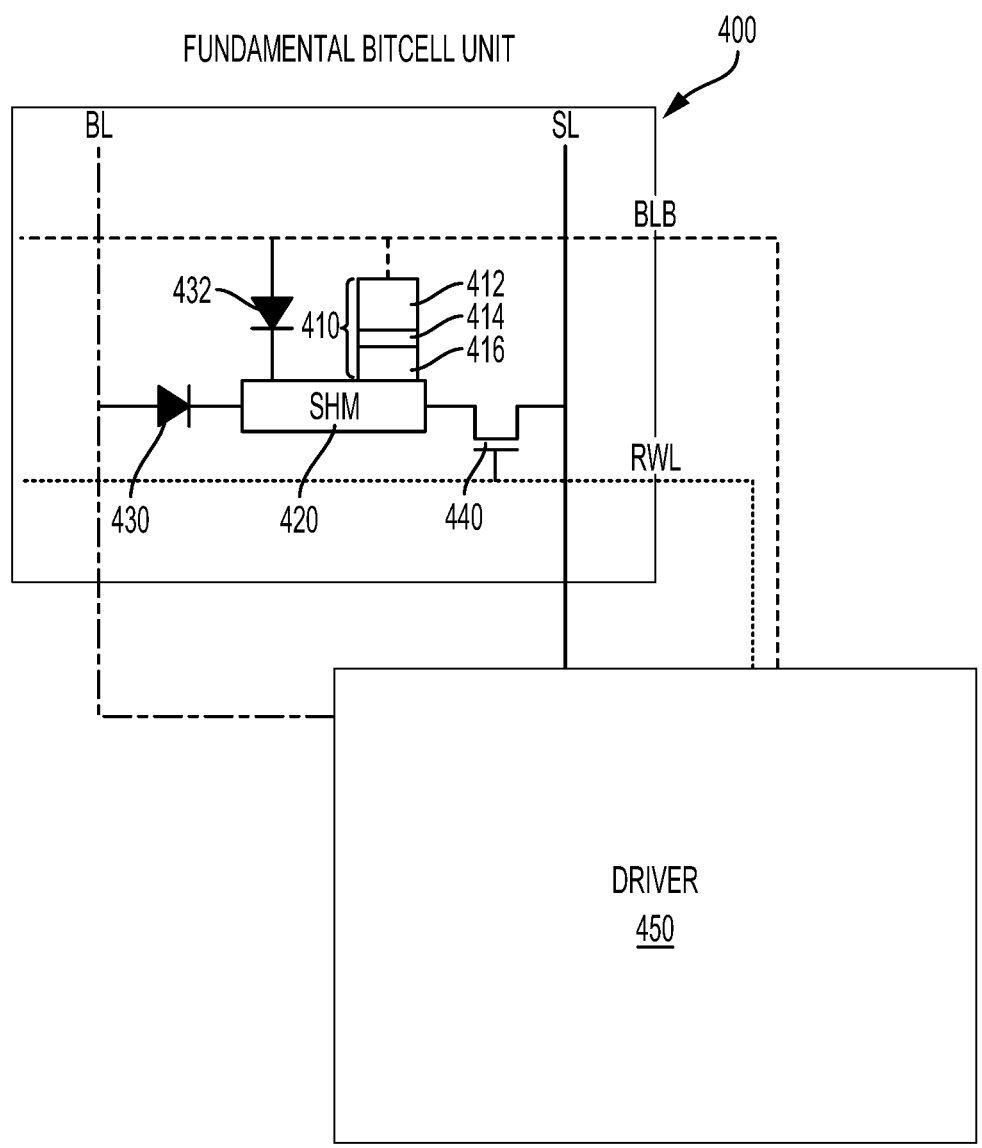
FIG. 4 illustrates a spin-orbit torque (SOT) and spin-transfer torque (STT) bit cell according to aspects of the present disclosure.

FIG. 4 illustrates a one transistor two diode (1T2D) spin-orbit torque (SOT) and spin-transfer torque (STT) bit cell 400 according to aspects of the present disclosure. The bit cell 400 (e.g., a magnetic random access memory (MRAM) memory cell) may include a magnetic tunnel junction (MTJ) 410 (e.g., a perpendicular MTJ (pMTJ)). The MTJ 410 may include a reference layer 412 (e.g., a fixed layer), a barrier layer 414 supporting the reference layer 412, and a free layer 416 supporting the barrier layer 414. In addition, the bit cell 400 may include a spin-hall conductive material (SHM) layer 420 supporting the free layer 416 of the MTJ 410. The SHM layer 420 may be platinum (Pt), tantalum (Ta), tungsten (W), or other known spin-hall metals. In addition, the barrier layer 414 may be magnesium oxide (MgO), or other known barrier layer materials.

In aspects of the present disclosure, the bit cell 400 includes a first diode 430 and a second diode 432 coupled to the SHM layer 420. The first diode 430 may be coupled to a bit line (BL), and the second diode 432 may be coupled to a bit line bar (BLB). The reference layer 412 may also be coupled to the BLB. The first diode 430 and the second diode 432 may provide a reverse bias to prevent cross-coupling between other bit cells. The SHM layer 420 may further be coupled to a transistor 440 (e.g., an NMOS or isolation transistor). A gate of the transistor 440 may be coupled to a read word line (RWL). The transistor 440 may further be coupled to a source line (SL).

A bias of the transistor 440 may be varied to induce more or less current from flowing across the SHM layer 420 and/or across the MTJ 410. For example, an MTJ resistance ($R_{MTJ}$) and a spin-hall effect resistance ($R_{SHE}$) may be tuned to direct the STT current ($I_{STT}$) through the MTJ 410 to set a write value. This may be performed by tuning a resistance area product (RA) of the $R_{MTJ}$ according to the STT current $I_{STT}$. The $R_{MTJ}$ may also be tuned by varying the dimensions of the MTJ 410. Additionally, the $R_{SHE}$ may be tuned by varying the material of the SHM layer 420 and the dimensions of the SHM layer 420. For example, increasing a width of the SHM layer 420 would lower the $R_{SHE}$. Alternatively, a resistance across the barrier layer 414 may be varied to create the same effect.

The reference layer 412 may include a magnetic state with an orientation perpendicular to a plane of the barrier layer 414. For example, the magnetic state may either be pointing toward the barrier layer 414 (e.g., anti-parallel) or pointing away from the barrier layer 414 (e.g., parallel). The magnetic state of the reference layer 412 may be fixed either parallel or anti-parallel. In addition, the free layer 416 may include a magnetic state that is either parallel or anti-parallel to the magnetic state of the reference layer 412. In some aspects, whether the magnetic state of the free layer 416 is parallel or anti-parallel to the magnetic state of the reference layer may determine if the bit cell represents a "1" or a "0." The magnetic state of the free layer 416 may be changed from being parallel to anti-parallel to the magnetic state of the reference layer 412, or vice versa.

This aspect of the present disclosure includes a driver 450 operable to set a state of the bit cell 400 using a spin-transfer torque (STT) current $I_{STT}$. Switching of the free layer 416 to be either parallel or anti-parallel to the reference layer 412 may be accomplished by applying a current to the SHM layer 420. The SHM layer 420 may generate a spin-orbit torque (SOT) via the spin-hall effect (SHE). For example, the STT current ($I_{STT}$) may be applied through the SHM layer 420 that is parallel to a plane of the free layer 416 to agitate or destabilize the magnetic state of the MTJ 410. The SOT may generate a spin current that is perpendicular to a magnetic state of the free layer 416, which in turn causes the magnetic state of the free layer 416 to become parallel to the plane of the free layer 416. Simultaneously, a weak current is applied across the MTJ 410 in either a parallel or anti-parallel direction to the reference layer 412 to set the state of the MTJ 410. Depending on whether the weak current is parallel or anti-parallel to the reference layer 412, the magnetic moment of the free layer 416 rotates up or down to follow the orientation of the weak current.

Figure 5:
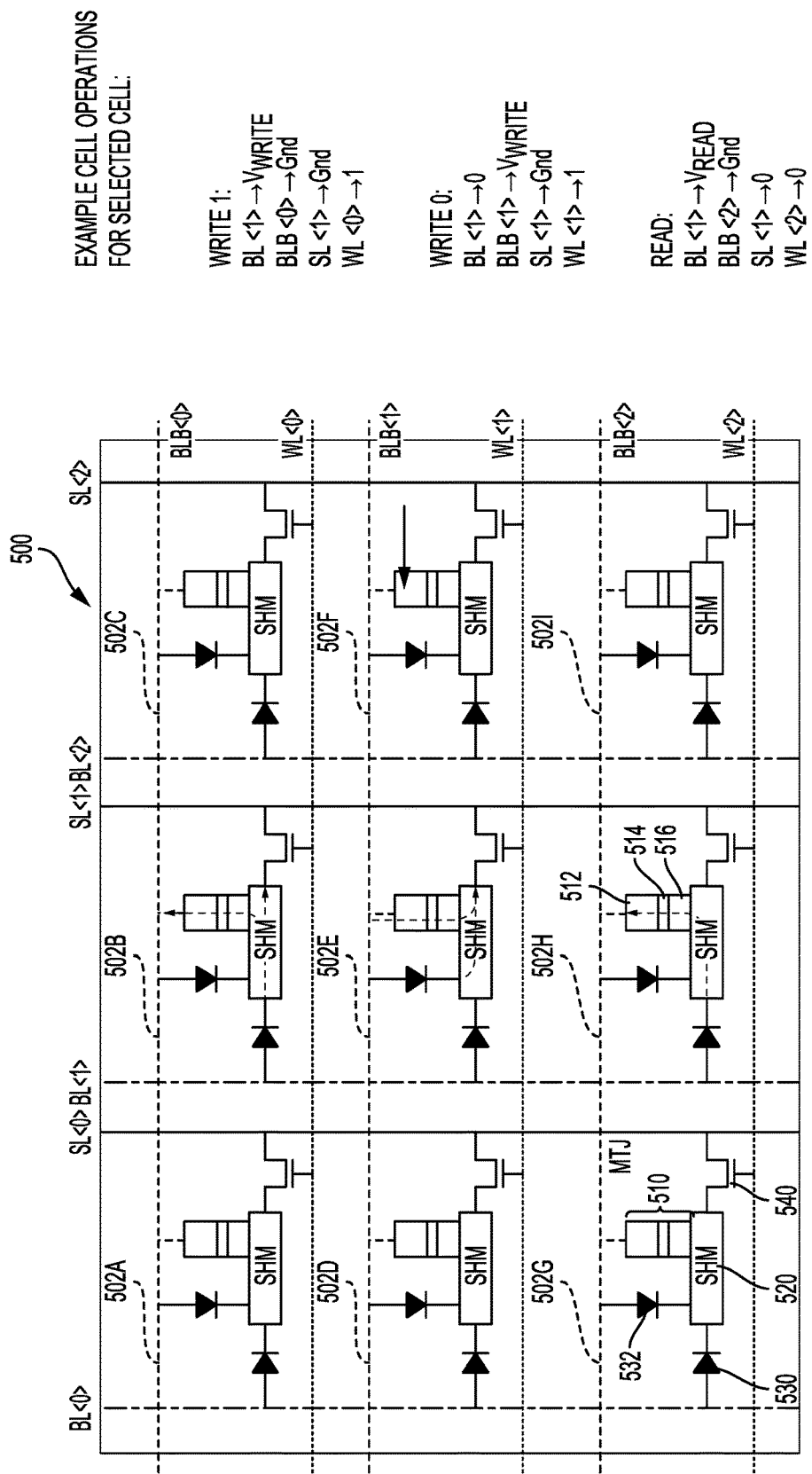
FIG. 5 illustrates a spin-orbit torque (SOT) and spin-transfer torque (STT) bit cell array according to aspects of the present disclosure.

FIG. 5 illustrates a two transistor (2T) spin-orbit torque (SOT) and spin-transfer torque (STT) bit cell array 500 according to aspects of the present disclosure. The bit cell array 500 illustrates how the bit cell 400 described in FIG. 4 may be implemented in an array of bit cells 502A-502I. The bit cell array 500 may be a magnetic random access memory (MRAM) array.

Each of the bit cells 502A-502I may include a magnetic tunnel junction (MTJ) 510 (e.g., a perpendicular MTJ (pMTJ)). The MTJ 510 may include a reference layer 512 (e.g., a fixed layer), a barrier layer 514 supporting the reference layer 512, and a free layer 516 supporting the barrier layer 514. In addition, the bit cell array 500 may include a spin-hall conductive material (SHM) layer 520 supporting the free layer 516 of the MTJ 510. In related versions, the SHM layer 520 may be Pt, Ta, W, or other known spin-hall metals. In related versions, the barrier layer 514 may be MgO, or other known barrier layer materials.

In aspects of the present disclosure, the bit cell array 500 includes a first diode 530 and a second diode 532 coupled to the SHM layer 520. The first diode 530 may be coupled to a bit line (BL), and the second diode 532 may be coupled to a bit line bar (BLB). The reference layer 512 may also be coupled to the BLB. The first diode 530 and the second diode 532 may provide a reverse bias to prevent cross-coupling between the bit cells 502A-502I. The SHM layer 520 may further be coupled to a transistor 540 (e.g., an NMOS). A gate of the transistor 540 may be coupled to a word line (WL). The transistor 540 may further be coupled to a source line (SL).

Bit cells 502A-502I arranged in a same row may share a common BLB and WL. For example, bit cells 502A-502C may share the BLB <0> and the WL <0>. Bit cells 502A-502I arranged in a same column may share a common BL and SL. For example, bit cells 502A, 502D, and 502G may share the BL <0> and the SL <0>. The 3×3 bit cell array 500 is exemplary only, and it is understood that larger arrays of varying dimensions are permitted.

In related aspects, a bias of the transistor 540 is varied to induce more or less current from flowing across the SHM layer 520 and/or across the MTJ 510. For example, an MTJ resistance ($R_{MTJ}$) and a spin-hall effect resistance ($R_{SHE}$) may be tuned to direct the STT current ($I_{STT}$) through the MTJ 510 to set a write value. This may be performed by tuning a resistance area product (RA) of the $R_{MTJ}$ according to the STT current $I_{STT}$. The $R_{MTJ}$ may also be tuned by varying the dimensions of the MTJ 510. Additionally, the $R_{SHE}$ may be tuned by varying the material of the SHM layer 520 and the dimensions of the SHM layer 520. For example, increasing a width of the SHM layer 520 would lower the $R_{SHE}$. Alternatively, a resistance across the barrier layer 514 may be varied to create the same effect.

The reference layer 512 may include a magnetic state with an orientation perpendicular to a plane of the barrier layer 514. For example, the magnetic state may either be pointing toward the barrier layer 514 (e.g., anti-parallel) or pointing away from the barrier layer 514 (e.g., parallel). The magnetic state of the reference layer 512 may be fixed either parallel or anti-parallel. In addition, the free layer 516 may include a magnetic state that is either parallel or anti-parallel to the magnetic state of the reference layer 512. In some aspects, whether the magnetic state of the free layer 516 is parallel or anti-parallel to the magnetic state of the reference layer may determine if the bit cell represents a "1" or a "0." The magnetic state of the free layer 516 may be changed from being parallel to anti-parallel to the magnetic state of the reference layer 512, or vice versa.

Switching of the free layer 516 to be either parallel or anti-parallel to the reference layer 512 may be accomplished by applying a current to the SHM layer 520. The SHM layer 520 may generate a spin-orbit torque (SOT) via the spin-hall effect (SHE). For example, a current may be applied through the SHM layer 520 that is parallel to a plane of the free layer 516. The SOT may generate a spin torque that is perpendicular to a magnetic state of the free layer 516, which in turn causes the magnetic moment of the free layer 516 to become parallel to the plane of the free layer 516. Simultaneously, a weak current is applied across the MTJ 510 in either a parallel or anti-parallel direction to the reference layer 512. Depending on whether the weak current is parallel or anti-parallel to the reference layer 512, the magnetic moment of the free layer 516 rotates up or down to follow the orientation of the weak current.

In operation, a "1" may be written into the bit cell 502B by applying a $V_{write}$ signal across bit line (BL)<1>. Bit line bar (BLB)<0> and source line (SL)<1> may be grounded, and a current may be applied to word line (WL)<0> to switch on the transistor 540. The $V_{write}$ signal may travel through the SHM layer 520 and the MTJ 510 in an upward direction, causing the magnetic moment of the free layer 516 to rotate into a parallel orientation to represent a "1," as seen by the dashed arrows (e.g., parallel to the reference layer 512). More current will flow through the SHM layer 520 than through the MTJ 510 due to the bias of the transistor 540 and/or the resistivity of the metals. It is understood that other bit cells may be written by varying the selection of BL, BLB, SL, and WL.

In operation, a "0" may be written into the center bit cell 502E by applying a $V_{write}$ signal across BLB <1>. BL <1> may be set to off, SL <1> may be grounded, and WL <1> may be se to on to switch on the transistor 540. The $V_{write}$ signal may travel through the MTJ 510 in a downward direction and through the SHM layer 520, causing the magnetic moment of the free layer 516 to rotate into an anti-parallel orientation to represent a "0," as seen by the dashed arrows (e.g., anti-parallel to the reference layer 512). More current will flow through the SHM layer 520 than through the MTJ 510 due to the bias of the transistor 540 and/or the resistivity of the metals. It is understood that other bit cells may be written by varying the selection of BL, BLB, SL, and WL.

In operation, reading the bit cell 502H may be accomplished by applying a $V_{read}$ signal across BL <1>, grounding BLB <2>, and turning SL <1> and WL <2> off. The $V_{read}$ signal travels through the MTJ 510, either parallel or anti-parallel to the magnetic moments of the reference layer 512 and the free layer 516 to read whether it is a "1" or a "0." The dashed arrow illustrates the current flow. Because the $V_{read}$ signal does not exert much force on the magnetic state of the free layer 516, the $V_{read}$ signal can be equal to or even greater than the $V_{write}$ signal. It is understood that other bit cells may be read by varying the selection of BL, BLB, SL, and WL. In addition, the bit cell array 500 may also include the driver 450, as shown in FIG. 4, operable to set a state of at least one of the bit cells using a spin-transfer torque (STT) current $I_{STT}$.

Figure 6:
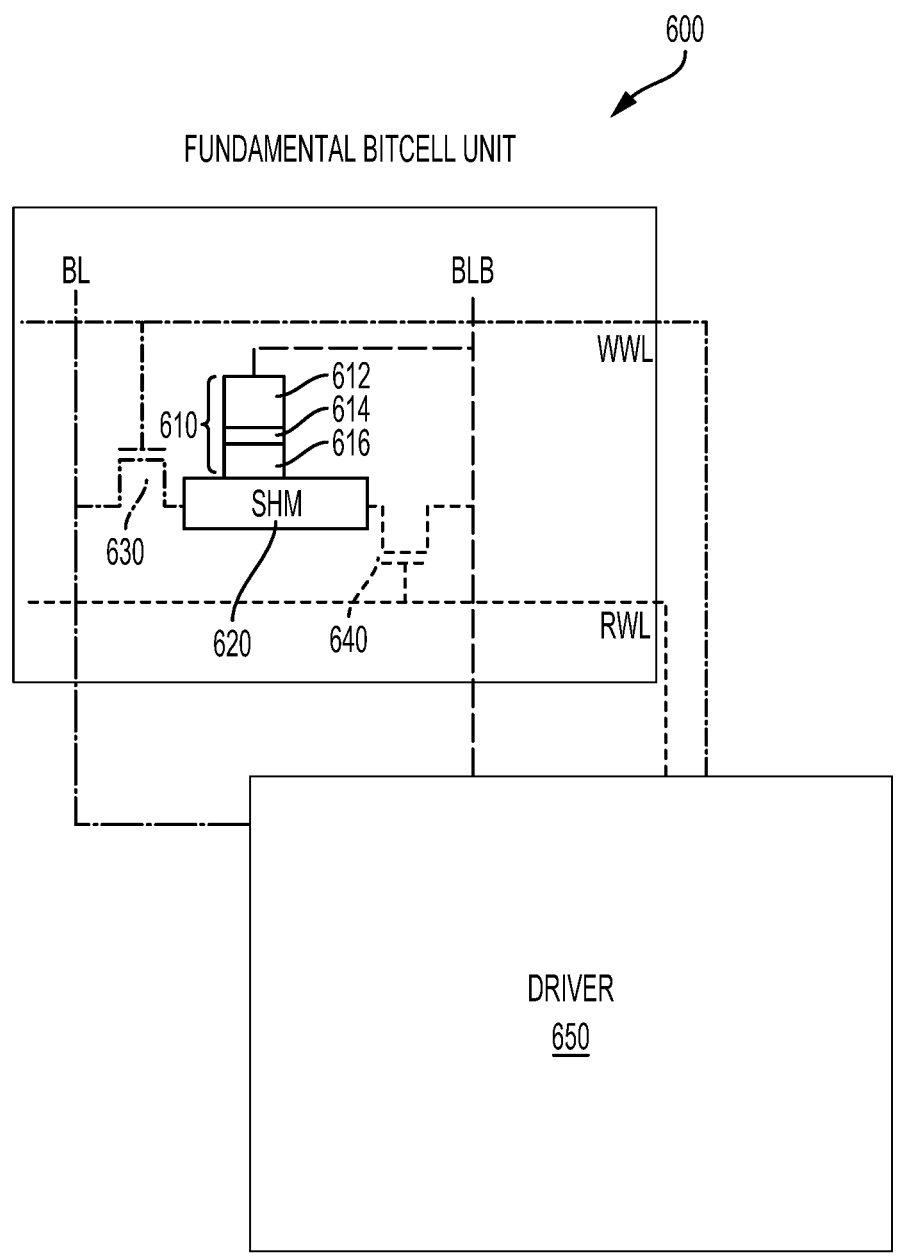
FIG. 6 illustrates a spin-orbit torque (SOT) and spin-transfer torque (STT) bit cell according to aspects of the present disclosure.

FIG. 6 illustrates a spin-orbit torque (SOT) and spin-transfer torque (STT) bit cell 600 according to aspects of the present disclosure. The bit cell 600 (e.g., a magnetic random access memory (MRAM) memory cell) may include a magnetic tunnel junction (MTJ) 610 (e.g., a perpendicular MTJ (pMTJ)). The MTJ 610 may include a reference layer 612, a barrier layer 614 supporting the reference layer 612 (e.g., a fixed layer), and a free layer 616 supporting the barrier layer 614. In addition, the bit cell 600 may include a spin-hall conductive material (SHM) layer 620 supporting the free layer 616 of the MTJ 610. In related versions, the SHM layer 620 may be Pt, Ta, W, or other known spin-hall metals. In related versions, the barrier layer 614 may be MgO, or other known barrier layer materials.

In aspects of the present disclosure, the bit cell 600 includes a first transistor 630 (e.g., an NMOS) coupled to the SHM layer 620. A gate of the first transistor 630 may be coupled to a write word line (WWL). The first transistor 630 may further be coupled to a bit line (BL). The SHM layer 620 may further be coupled to a second transistor 640 (e.g., an NMOS). A gate of the second transistor 640 may be coupled to a read word line (RWL). The second transistor 640 may further be coupled to a bit line bar (BLB). The reference layer 612 may also be coupled to the BLB. The second transistor 640 may provide a reverse bias to prevent cross-coupling between other bit cells.

In related aspects, a bias of the second transistor 640 is varied to induce more or less current from flowing across the SHM layer 620 and/or across the MTJ 610. For example, an MTJ resistance ($R_{MTJ}$) and a spin-hall effect resistance ($R_{SHE}$) may be tuned to direct the STT current ($I_{STT}$) through the MTJ 610 to set a write value. This may be performed by tuning a resistance area product (RA) of the $R_{MTJ}$ according to the STT current ($I_{STT}$). The $R_{MTJ}$ may also be tuned by varying the dimensions of the MTJ 610. Additionally, the $R_{SHE}$ may be tuned by varying the material of the SHM layer 620 and the dimensions of the SHM layer 620. For example, increasing a width of the SHM layer 620 would lower the $R_{SHE}$. Alternatively, a resistance across the barrier layer 614 may be varied to create the same effect.

The reference layer 612 may include a magnetic state with an orientation perpendicular to a plane of the barrier layer 614. For example, the magnetic state may either be pointing toward the barrier layer 614 (e.g., anti-parallel) or pointing away from the barrier layer 614 (e.g., parallel). The magnetic state of the reference layer 612 may also be fixed parallel or antiparallel. In addition, the free layer 616 also includes a magnetic state that is either parallel or anti-parallel to the magnetic state of the reference layer 612. In some aspects, whether the magnetic state of the free layer 616 is parallel or anti-parallel to the magnetic state of the reference layer may determine if the bit cell represents a "1" or a "0." The magnetic state of the free layer 616 may be changed from being parallel to anti-parallel to the magnetic state of the reference layer 612, or vice versa.

This aspect of the present disclosure also includes a driver 650 operable to set a state of the bit cell 600 using a spin-transfer torque (STT) current ($I_{STT}$). Switching of the free layer 616 to be either parallel or anti-parallel to the reference layer 612 may be accomplished by applying a current to the SHM layer 620. The SHM layer 620 may generate a spin-orbit torque (SOT) via the spin-hall effect (SHE). For example, the STT current ($I_{STT}$) may also be applied through the SHM layer 620 that is parallel to a plane of the free layer 616. The SOT may generate a spin current that is perpendicular to a magnetic state of the free layer 616, which in turn causes the magnetic state of the free layer 616 to become parallel to the plane of the free layer 616. Simultaneously, a weak current is applied across the MTJ 610 in either a parallel or anti-parallel direction to the reference layer 612. Depending on whether the weak current is parallel or anti-parallel to the reference layer 612, the magnetic moment of the free layer 616 rotates up or down to follow the orientation of the weak current.

Figure 7:
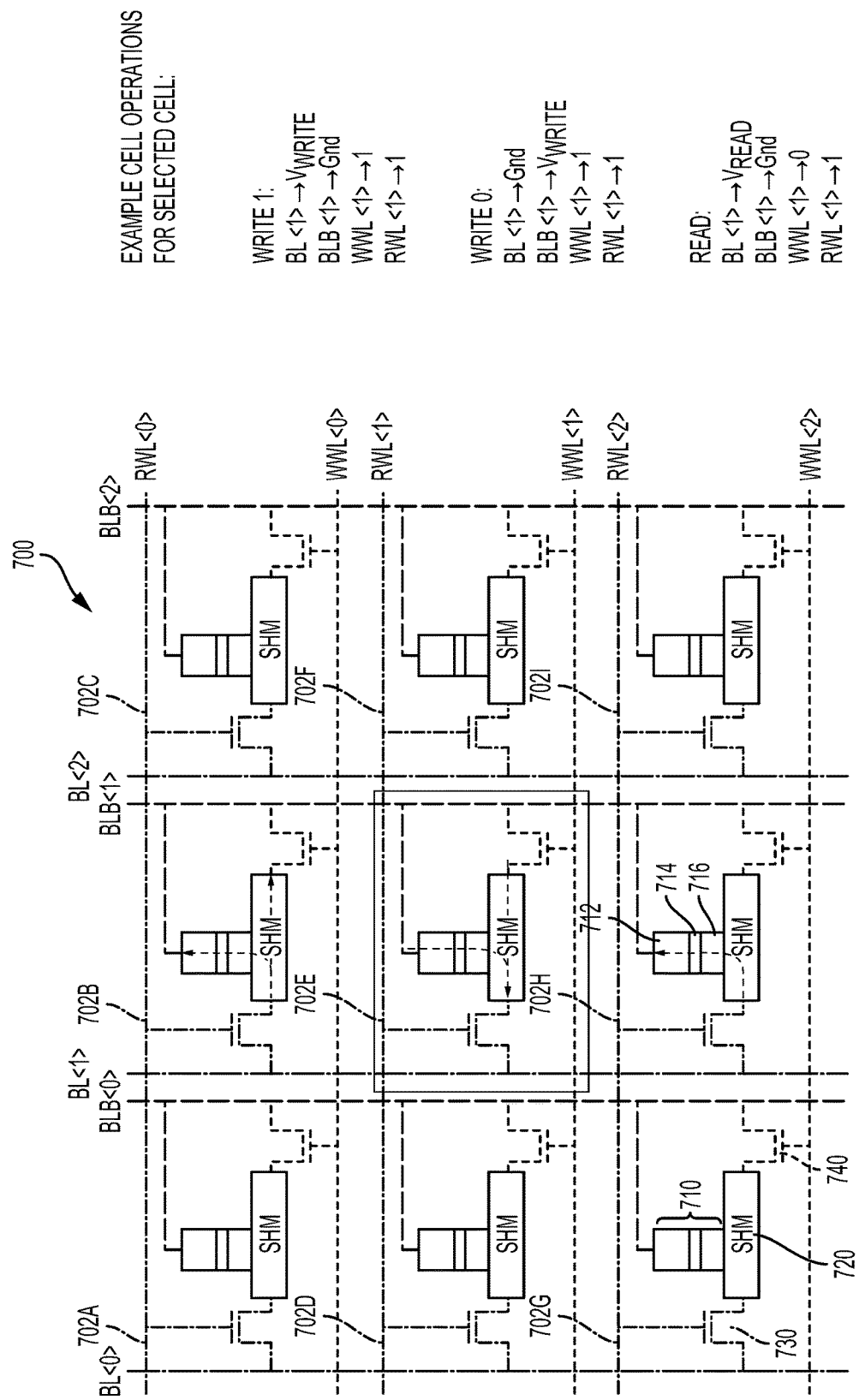
FIG. 7 illustrates a spin-orbit torque (SOT) and spin-transfer torque (STT) bit cell array according to aspects of the present disclosure.

FIG. 7 illustrates a spin-orbit torque (SOT) and spin-transfer torque (STT) bit cell array 700 according to aspects of the present disclosure. The bit cell array 700 illustrates how the bit cell 600 described in FIG. 6 may be implemented in an array of bit cells 702A-702I. The bit cell array 700 may be a magnetic random access memory (MRAM) array.

Each of the bit cells 702A-702I may include a magnetic tunnel junction (MTJ) 710 (e.g., a pMTJ). The MTJ 710 may include a reference layer 712, a barrier layer 714 supporting the reference layer 712 (e.g., a fixed layer), and a free layer 716. In addition, the memory cell may include a spin-hall conductive material (SHM) layer 720 supporting the free layer 716 of the MTJ 710. In related versions, the SHM layer 720 may be Pt, Ta, W, or other known spin-hall metals. In related versions, the barrier layer 714 may be MgO, or other known barrier layer materials.

In aspects of the present disclosure, the bit cell array 700 includes a first transistor 730 (e.g., an NMOS) coupled to the SHM layer 720. A gate of the first transistor 730 may be coupled to a write word line (WWL). The first transistor 730 may further be coupled to a bit line (BL). The SHM layer 720 may further be coupled to a second transistor 740 (e.g., an NMOS). A gate of the second transistor 740 may be coupled to a read word line (RWL). The second transistor 740 may further be coupled to a bit line bar (BLB). The reference layer 712 may also be coupled to the BLB. The second transistor 740 may provide a reverse bias to prevent cross-coupling between the bit cells 702A-702I.

Bit cells 702A-702I arranged in a same row may share a common RWL and WWL. For example, bit cells 702A-702C may share the RWL <0> and the WWL <0>. Bit cells 702A-702I arranged in a same column may share a common BL and BLB. For example, bit cells 702A, 702D, and 702G may share the BL <0> and the BLB <0>. The 3×3 bit cell array 700 is exemplary only, and it is understood that larger arrays of varying dimensions are permitted.

In related aspects, a bias of the second transistor 740 is varied to induce more or less current from flowing across the SHM layer 720 and/or across the MTJ 710. For example, an MTJ resistance ($R_{MTJ}$) and a spin-hall effect resistance ($R_{SHE}$) may be tuned to direct the STT current ($I_{STT}$) through the MTJ 710 to set a write value. This may be performed by tuning a resistance area product (RA) of the $R_{MTJ}$ according to the STT current ($I_{STT}$). The $R_{MTJ}$ may also be tuned by varying the dimensions of the MTJ 710. Additionally, the $R_{SHE}$ may be tuned by varying the material of the SHM layer 720 and the dimensions of the SHM layer 720. For example, increasing a width of the SHM layer 720 would lower the $R_{SHE}$. Alternatively, a resistance across the barrier layer 714 may be varied to create the same effect.

The reference layer 712 may include a magnetic state with an orientation perpendicular to a plane of the barrier layer 714. For example, the magnetic state may either be pointing toward the barrier layer 714 (e.g., anti-parallel) or pointing away from the barrier layer 714 (e.g., parallel). The magnetic state of the reference layer 712 may also be fixed parallel or anti-parallel. In addition, the free layer 716 may also include a magnetic state that is either parallel or anti-parallel to the magnetic state of the reference layer 712. In some aspects, whether the magnetic state of the free layer 716 is parallel or anti-parallel to the magnetic state of the reference layer may determine if the bit cell represents a "1" or a "0." The magnetic state of the free layer 716 may be changed from being parallel to anti-parallel to the magnetic state of the reference layer 712, or vice versa.

Switching of the free layer 716 to be either parallel or anti-parallel to the reference layer 712 may be accomplished by applying a current to the SHM layer 720. The SHM layer 720 may generate a spin-orbit torque (SOT) via the spin-hall effect (SHE). For example, a current (e.g., an STT current) may be applied through the SHM layer 720 that is parallel to a plane of the free layer 716. The SOT may generate a spin current that is perpendicular to a magnetic state of the free layer 716, which in turn causes the magnetic state of the free layer 716 to become parallel to the plane of the free layer 716. Simultaneously, a weak current is applied across the MTJ 710 in either a parallel or anti-parallel direction to the reference layer 712. Depending on whether the weak current is parallel or anti-parallel to the reference layer 712, the magnetic moment of the free layer 716 rotates up or down to follow the orientation of the weak current.

In operation, a "1" may be written into the bit cell 702B by applying a $V_{write}$ signal across bit line (BL) <1>. Bit line bar (BLB) <1> may be grounded, and write word line (WWL) <0> and read word line (RWL) <0> may be turned on to switch on the first transistor 730 and the second transistor 740. The $V_{write}$ signal may travel through the SHM layer 720 and the MTJ 710 in an upward direction, causing the magnetic moment of the free layer 716 to rotate into a parallel orientation to represent a "1," as seen by the dashed arrows. More current will flow through the SHM layer 720 than through the MTJ 710 due to the bias of the second transistor 740 and/or the resistivity of the metals. It is understood that other bit cells may be written by varying the selection of BL, BLB, WWL, and RWL.

In operation, a "0" may be written into the center bit cell 702E by applying a $V_{write}$ signal across BLB <1>. BL <1> may be grounded, and WWL <1> and RWL <1> may be turned on to switch on the first transistor 730 and the second transistor 740. The $V_{write}$ signal may travel through the MTJ 710 in a downward direction and through the SHM layer 720, causing the magnetic moment of the free layer 716 to rotate into an anti-parallel orientation to represent a "0," as seen by the dashed arrows. More current will flow through the SHM layer 720 than through the MTJ 710 due to the bias of the second transistor 740 and/or the resistivity of the metals. It is understood that other bit cells may be written by varying the selection of BL, BLB, WWL, and RWL.

In operation, reading the bit cell 702H may be accomplished by applying a $V_{read}$ signal across BL <1>, grounding BLB <1>, turning WWL <2> off, and turning RWL <2> on. The $V_{read}$ signal travels through the MTJ 710, either parallel or anti-parallel to the magnetic moments of the reference layer 712 and the free layer 716 to read whether it is a "1" or a "0." The dashed arrow illustrates the current flow. Because the $V_{read}$ signal does not exert much force on the magnetic state of the free layer 716, the $V_{read}$ signal can be equal to or even greater than the $V_{write}$ signal. It is understood that other bit cells may be read by varying the selection of BL, BLB, WWL, and RWL. The MRAM array may also include the driver 650, as shown in FIG. 6, operable to set a state of at least one of the bit cells using a spin-transfer torque (STT) current $I_{STT}$.

Advantages include smaller bit cell sizes, higher efficiency regarding spin-transfer torque generation from the SHM layer, and increased barrier layer endurance due to the reduced current. Additionally, deterministic switching may be achieved without an external magnetic field or using complex fabrication steps (e.g., anisotropy/oxidation gradients). This design uses a pMTJ for superior retention and resilience to an external field. In addition, this technique involves a lower voltage across a barrier layer (e.g., magnesium oxide (MgO)) for improved endurance (e.g., 5-10× reduction in $V_{barrier}$). In addition, this technique improves a read speed by allowing a large bias read (e.g., $V_{read}$ can be larger than $V_{write}$).

Figure 8:
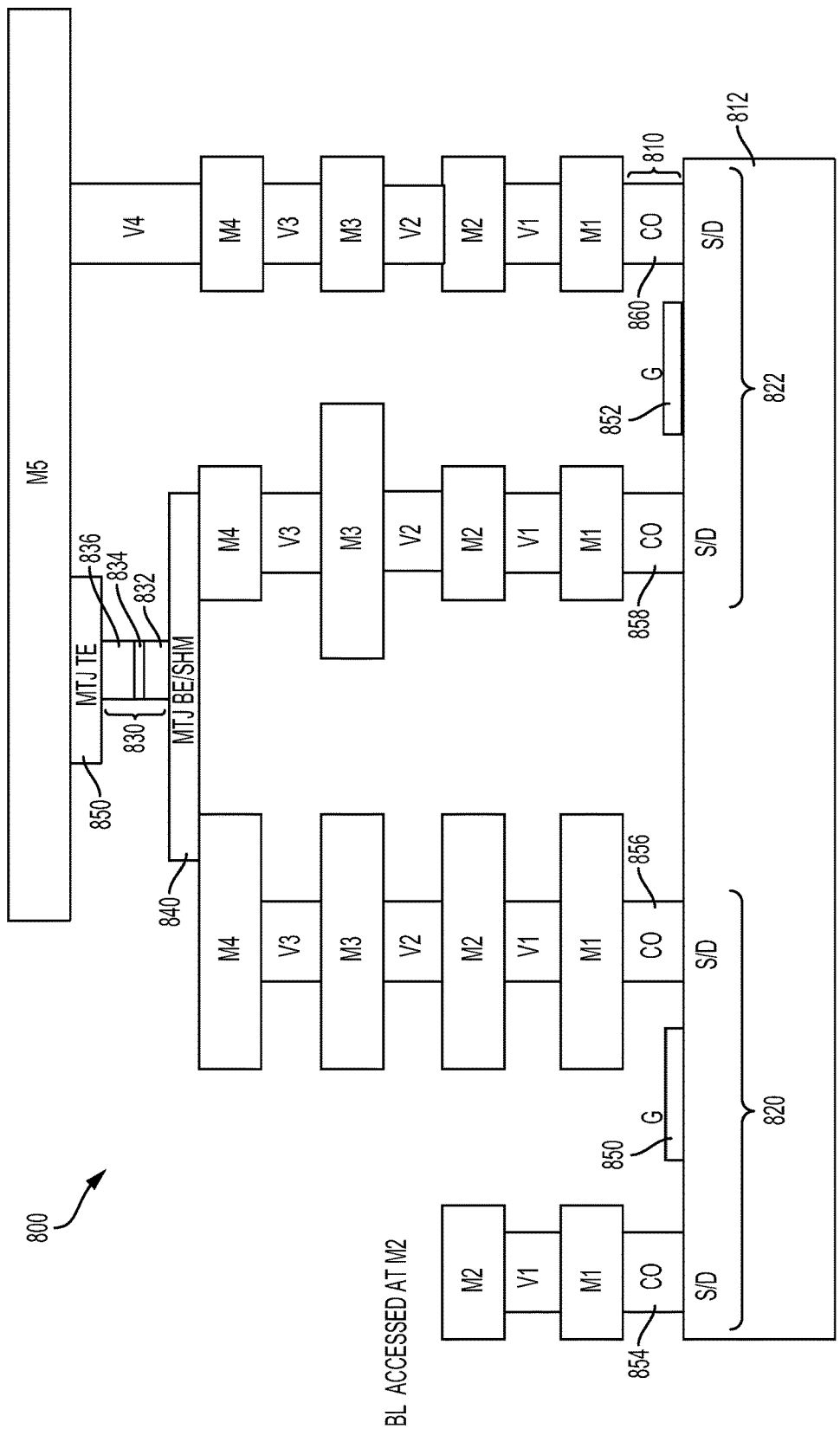
FIG. 8 illustrates a cross-sectional view of a semiconductor device for implementing a spin-orbit torque (SOT) assisted spin-transfer torque (STT) magnetic random access memory (MRAM) bit cell according to aspects of the present disclosure.

FIG. 8 illustrates a cross-sectional view of a semiconductor device 800 for implementing a spin-orbit torque (SOT) assisted spin-transfer torque (STT) magnetic random access memory (MRAM) bit cell according to aspects of the present disclosure. The semiconductor device 800 may include several layers of first through fourth vias V1-V4 and first through fifth metal layers (e.g., conductive interconnects) M1-M5 arranged epitaxially and supported by a contact layer 810. The contact layer 810 may be supported by a substrate layer 812 (e.g., silicon). The first through fourth vias V1-V4 and first through fifth metal layers M1-M5 may be fabricated according to a back-end-of-line (BEOL) process.

A magnetic tunnel junction (MTJ) 830 (e.g., a pMTJ) may be fabricated on a same layer as fifth via V5 to be coupled between the fourth metal layer M4 and the fifth metal layer M5 (e.g., a bit line bar (BLB) STT line). The bit line may be accessed at the second metal layer M2. In related aspects, the MTJ 830 may be fabricated according to a back-end-of-line (BEOL) process. For example, the MTJ 830 may be fabricated at any level corresponding to any of the first through fourth vias V1-V4 without departing from the scope of the disclosure. These are provided as examples only, and are non-limiting. For example, the MTJ 830 may be fabricated at a lower metal level such as M1 or M2 also.

The MTJ 830 may include a free layer 832 supported by a spin-hall metal (SHM) layer and a bottom electrode (BE) 840 for coupling with the fourth metal layer M4. A barrier layer 834 may be supported by the free layer 832. A reference layer 836 (e.g., a fixed layer) may be supported by the barrier layer 834. A bit line contact (e.g., an MTJ top electrode (TE) layer) 850 may be on the reference layer 836, for coupling with the fifth metal layer M5. In related versions, the SHM layer 840 is one of the noted spin-hall metals. In addition, the barrier layer 834 is one of the noted barrier layer materials.

A first transistor 820 and a second transistor 822 may be fabricated on the substrate layer 812 according to a front-end-of-line (FEOL) process. The first transistor 820 and second transistor 822 may include first and second gates 850, 852, respectively. The first transistor 820 and the second transistor 822 may further include bit line contacts (e.g., source/drain contacts) 854, 856, 858, and 860 that are located on the contact layer 810 (e.g., tungsten). The bit line contacts 854, 856, 858, and 860 may couple the first transistor 820 and the second transistor 822 to the MTJ 830, the BL, and the BLB. It is noted that FIG. 8 is not drawn to scale. For example, the components may increase in magnitude from the substrate layer 812 towards the fifth metal layer M5. Additionally, the MTJ 830 may be very small in relation to the other components.

Figure 9:
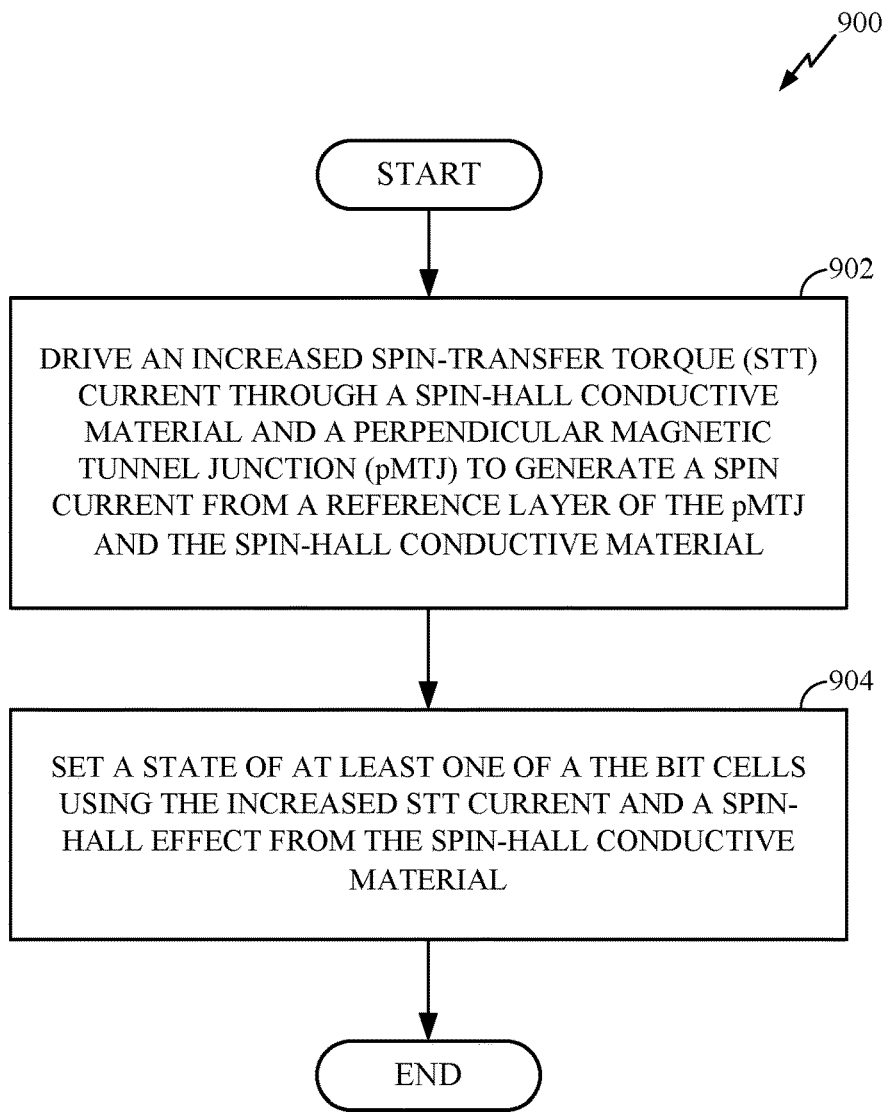
FIG. 9 is a process flow diagram illustrating a method of storing memory using spin-orbit torque (SOT) and spin-transfer torque (STT) bit cell arrays according to aspects of the present disclosure.

FIG. 9 is a process flow diagram illustrating a method of storing memory using spin-orbit torque (SOT) and spin-transfer torque (STT) bit cell arrays according to aspects of the present disclosure. The method 900 includes, at block 902, driving an increased spin-transfer torque (STT) current through a spin-hall conductive material and a perpendicular magnetic tunnel junction (pMTJ) to generate a spin current from a reference layer of the pMTJ and the spin-hall conductive material. For example, switching of the free layer 516, 716 to be either parallel or anti-parallel to the reference layer 512, 712 may be accomplished by applying a current to the spin-hall metal (SHM) layer 520, 720. The SHM layer 520, 720 may generate a spin-orbit torque (SOT) via the spin-hall effect (SHE).

For example, a current may be applied through the SHM layer 520, 720 that is parallel to a plane of the free layer 516, 716. The SOT may generate a spin current that is perpendicular to a magnetic state of the free layer 516, 716, which in turn causes the magnetic state of the free layer 516, 716 to become parallel to the plane of the free layer 516, 716. Simultaneously, a weak current is applied across the MTJ 510, 710 in either a parallel or anti-parallel direction to the reference layer 512, 712. Depending on whether the weak current is parallel or anti-parallel to the reference layer 512, 712, the magnetic moment of the free layer 516, 716 rotates up or down to follow the orientation of the weak current.

The method 900 may further include, at block 904, setting a state of at least one of the bit cells using the increased STT current and a spin-hall effect from the spin-hall conductive material. For example, a "1" may be set when the magnetic state of the free layer 516, 716 is parallel. A "0" may be set when the magnetic state of the free layer 516, 716 is anti-parallel.

The method 900 may further include contacting a bit line on the reference layer. For example, the bit line may be used in read and/or write operations with respect to the bit cell array 500, 700. The spin-hall conductive material may be a pair of source line contacts. For example, the source line contacts may be used in read and/or write operations with respect to the bit cell array 500, 700 by flowing a current between the pair of source line contacts. In addition, the bit cell may be a one-transistor, two-diode, and one-junction memory cell (see FIGS. 4 and 5). Alternatively, the bit cell may by a two-transistor and one-junction memory cell (see FIGS. 6 and 7).

In related aspects, the method 900 further includes tuning an MTJ resistance and a spin-hall effect resistance to direct the increased STT current through the MTJ to set a write value. For example, during a write operation, a bias of the transistor 540 or the second transistor 740 may be varied to induce more or less current from flowing across the SHM layer 520, 720 and/or across the MTJ 510, 710. For example, an MTJ resistance ($R_{MTJ}$) and a spin-hall effect resistance ($R_{SHE}$) may be tuned to direct the STT current ($I_{STT}$) through the MTJ 510, 710 to set a write value. The $R_{MTJ}$ may also be tuned by varying the dimensions of the MTJ 510, 710. Additionally, the $R_{SHE}$ may be tuned by varying the material of the SHM layer 520, 720 and the dimensions of the SHM layer 520, 720.

In related aspects, the method 900 further includes tuning a resistance area product according to the increased STT current. For example, a resistance across the barrier layer 514, 714 may be varied to induce more or less current from flowing across the SHM layer 520, 720 and/or across the MTJ 510, 710. The $R_{MTJ}$ may also be tuned by varying the dimensions of the MTJ 510, 710. Additionally, the $R_{SHE}$ may be tuned by varying the material of the SHM layer 520, 720 and the dimensions of the SHM layer 520, 720. For example, increasing a width of the SHM layer 520, 720 would lower the $R_{SHE}$. Alternatively, a resistance across the barrier layer 514, 714 may be varied to create the same effect.

According to an aspect of the present disclosure, an MRAM array may include bit cells, in which each bit cell includes a pMTJ. The pMTJ includes a reference layer, a barrier layer supporting the reference layer, and a free layer supporting the barrier layer. A spin-hall conductive material layer may support the free layer. The MRAM array also includes means for setting a state of at least one of the of bit cells using an increased spin-transfer torque (STT) current and a spin-hall effect from the spin-hall conductive material. The state is set by driving the increased STT current through the spin-hall conductive material and the pMTJ so that a spin current is generated from the reference layer and the spin-hall conductive material. The driving means may be the driver 450, 650, as shown in FIGS. 4 and 6. In another aspect, the aforementioned means may be any module or any apparatus or material configured to perform the functions recited by the aforementioned means.

Spin-hall effect (SHE) is a spintronic analogue to the conventional hall effect. For example, spin-orbit torque (SOT) due to the spin-hall effect may originate from the coupling of charge and spin currents due to spin-orbit interactions. Due to the spin-hall effect, charge current flowing through a spin-hall metal (SHM) results in spin accumulation (e.g., spatial separation) at interfaces due to spin-orbit interaction. This phenomenon is due to an electron scattering mechanism, in which the electrons are separated according to their spin sign.

Aspects of the present disclosure are directed to improve the switching/writing of MTJs without degrading other properties such as read performance, endurance, or retention. One aspect of the present disclosure is directed to spin-orbit torque (SOT) assisted MRAM switching for increasing switch speed and endurance, while reducing switching energy. In this aspect of the present disclosure, an STT current (e.g., $I_{STT}$) is relied on to select the state of the SOT assisted MRAM. The spin-orbit torque assisted STT-MRAM design takes advantage of a fast reversal speed of spin-orbit torque, while relaying on perpendicular STT to select the state (e.g., parallel/anti-parallel).

Figure 10:
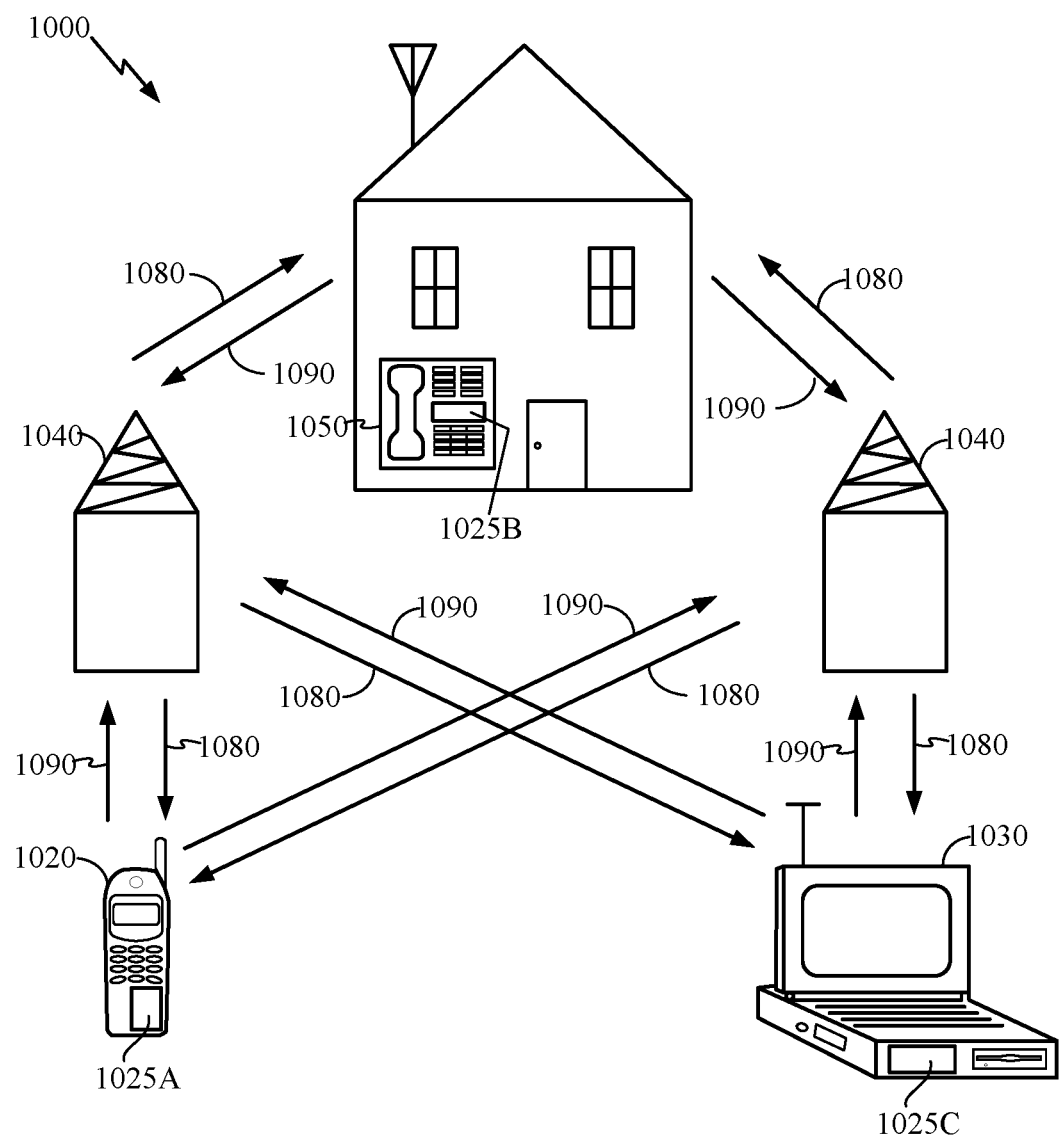
FIG. 10 is a block diagram showing an exemplary wireless communication system in which a configuration of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed pMTJ devices. It will be recognized that other devices may also include the disclosed pMTJ devices, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be a mobile phone, a hand-held personal communication systems (PCS) unit, a portable data unit such as personal digital assistant (PDA), a GPS enabled device, a navigation device, a set top box, a music player, a video player, an entertainment unit, a fixed location data unit such as a meter reading equipment, or a communications device that stores or retrieves data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed pMTJ devices.

Figure 11:
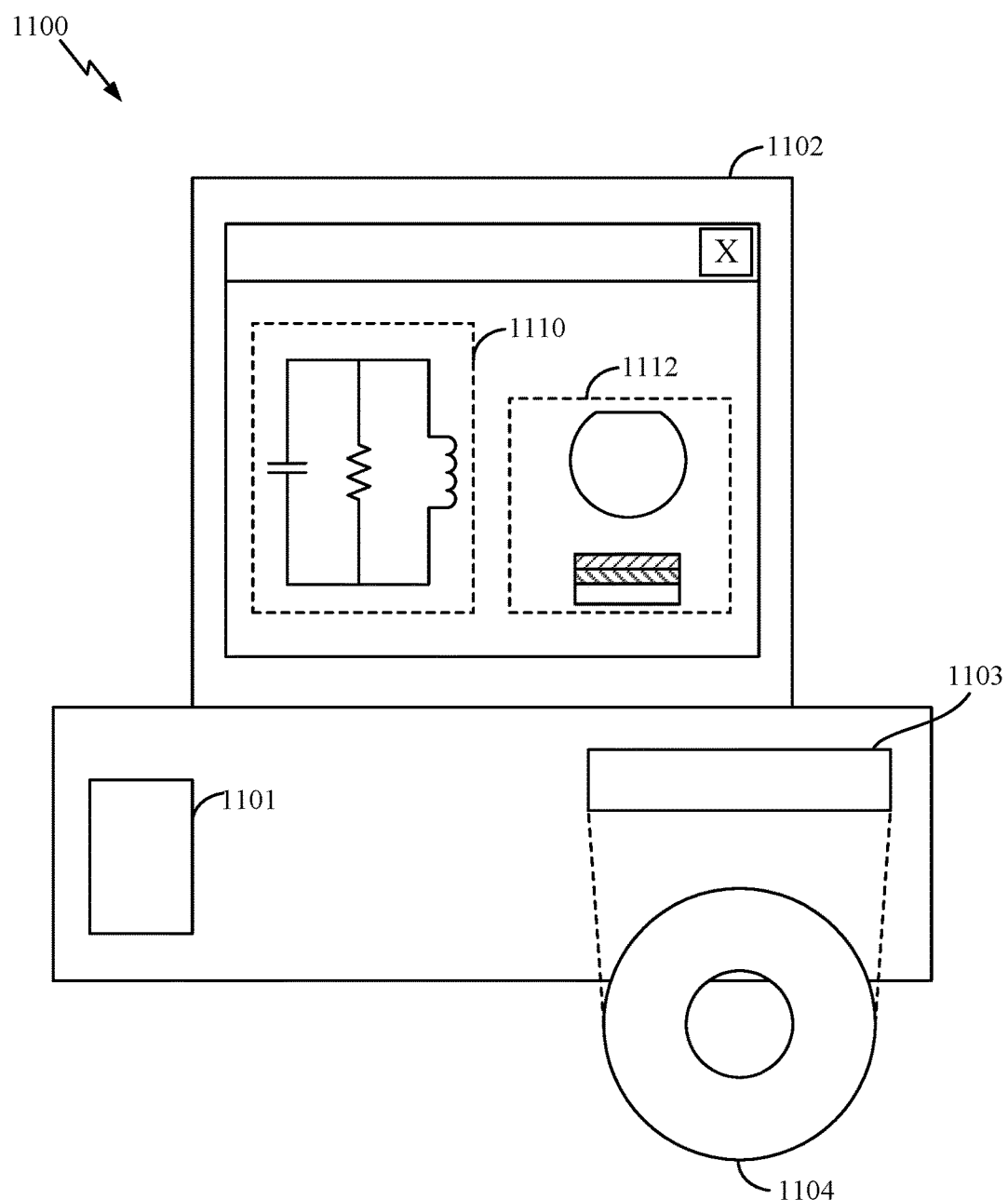
FIG. 11 is a block diagram illustrating a design workstation used for circuit, layout, and logic design of a semiconductor component according to one aspect of the present disclosure.

FIG. 11 is a block diagram illustrating a design workstation used for circuit, layout, and logic design of a semiconductor component, such as the perpendicular magnetic tunnel junction (pMTJ) structures disclosed above. A design workstation 1100 includes a hard disk 1101 containing operating system software, support files, and design software such as Cadence or OrCAD. The design workstation 1100 also includes a display 1102 to facilitate design of a circuit 1110 or a semiconductor component 1112 such as a perpendicular magnetic tunnel junction structure in accordance with an aspect of the present disclosure. A storage medium 1104 is provided for tangibly storing the design of the circuit 1110 or the semiconductor component 1112. The design of the circuit 1110 or the semiconductor component 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit 1110 or the semiconductor component 1112 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core), or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A magnetic random access memory (MRAM) array, comprising:
   a plurality of bit cells, each of the plurality of bit cells comprising:
      a perpendicular magnetic tunnel junction (pMTJ) including a reference layer, a barrier layer supporting the reference layer, and a free layer supporting the barrier layer;
      a spin-hall conductive material layer supporting the free layer;
      at least one transistor coupled to the spin-hall conductive material layer; and
      at least two diodes coupled to the spin-hall conductive material layer; and
   a driver operable to set a state of at least one of the plurality of bit cells using a spin-transfer torque (STT) switching current and a spin current by driving the STT switching current through both the spin-hall conductive material layer to generate a spin-orbit torque (SOT) and the pMTJ, the SOT generating the spin current through the pMTJ.

2. The MRAM array of claim 1, further comprising a bit line contact on the reference layer.

3. The MRAM array of claim 1, further comprising a pair of source line contacts on the spin-hall conductive material layer.

4. The MRAM array of claim 3, in which a current flows between the pair of source line contacts.

5. The MRAM array of claim 1, in which each of the plurality of bit cells comprises a one-junction memory cell.

6. The MRAM array of claim 1, integrated into at least one of a music player, a video player, an entertainment unit, a navigation device, a communications device, a personal digital assistant (PDA), a fixed location data unit, a mobile phone, and a portable computer.

7. A method of storing data in a magnetic random access memory (MRAM) array, comprising:
   driving a spin-transfer torque (STT) switching current through at least two diodes, a spin-hall conductive material coupled to the at least two diodes, a transistor coupled to the spin-hall conductive material, and a perpendicular magnetic tunnel junction (pMTJ), the STT switching current generating a spin-orbit torque (SOT) to generate a spin current;
   driving the spin current through the pMTJ; and
   setting a state of at least one of a plurality of bit cells using the STT switching current and the spin current.

8. The method of claim 7, further comprising contacting a bit line on the reference layer.

9. The method of claim 7, in which the spin-hall conductive material comprises a pair of source line contacts.

10. The method of claim 9, further comprising flowing a current between the pair of source line contacts.

11. The method of claim 7, further comprising tuning an MTJ resistance and a spin-hall conductive material resistance to direct the STT switching current through the pMTJ to set a write value.

12. The method of claim 7, further comprising tuning a resistance area product according to the STT switching current.

13. The method of claim 7, further comprising incorporating the MRAM array into at least one of a music player, a video player, an entertainment unit, a navigation device, a communications device, a personal digital assistant (PDA), a fixed location data unit, a mobile phone, and a portable computer.

14. A magnetic random access memory (MRAM) array, comprising:
   a plurality of bit cells, each of the plurality of bit cells comprising:
      a perpendicular magnetic tunnel junction (pMTJ) including a reference layer, a barrier layer supporting the reference layer, and a free layer supporting the barrier layer;
      a spin-hall conductive material layer supporting the free layer;
      at least one transistor coupled to the spin-hall conductive material layer; and
      at least two diodes coupled to the spin-hall conductive material layer; and
   means for setting a state of at least one of the plurality of bit cells using a spin-transfer torque (STT) switching current and a spin current by driving the STT switching current through both the spin-hall conductive material layer to generate a spin-orbit torque (SOT) and the pMTJ, the SOT generating the spin current through the pMTJ.

15. The MRAM array of claim 14, further comprising a bit line contact on the reference layer.

16. The MRAM array of claim 14, further comprising a pair of source line contacts on the spin-hall conductive material layer.

17. The MRAM array of claim 14, in which at least one of the plurality of bit cells comprises a one-junction memory cell.

18. The MRAM array of claim 14, integrated into at least one of a music player, a video player, an entertainment unit, a navigation device, a communications device, a personal digital assistant (PDA), a fixed location data unit, a mobile phone, and a portable computer.

* * * * *